US009752733B2

(12) United States Patent
Adams

(10) Patent No.: US 9,752,733 B2
(45) Date of Patent: Sep. 5, 2017

(54) INTERFACE AND FABRICATION METHOD FOR LIGHTING AND OTHER ELECTRICAL DEVICES

(71) Applicant: Cree, Inc., Durham, NC (US)

(72) Inventor: Edward Roger Adams, Englewood, TN (US)

(73) Assignee: Cree, Inc., Durham, NC (US)

(*) Notice: Subject to any disclaimer, the term of this patent is extended or adjusted under 35 U.S.C. 154(b) by 180 days.

(21) Appl. No.: 14/718,682

(22) Filed: May 21, 2015

(65) Prior Publication Data

US 2015/0252957 A1    Sep. 10, 2015

Related U.S. Application Data

(63) Continuation of application No. 12/730,802, filed on Mar. 24, 2010, now Pat. No. 9,039,271.

(51) Int. Cl.
*F21V 23/00* (2015.01)
*F21V 9/00* (2015.01)
(Continued)

(52) U.S. Cl.
CPC ............. *F21K 9/1355* (2013.01); *F21K 9/23* (2016.08); *F21K 9/90* (2013.01); *F21V 7/0008* (2013.01);
(Continued)

(58) Field of Classification Search
CPC ............. F21K 9/235–9/278; F21K 9/90; H01J 5/48–5/62; H05K 1/117; H05K 3/403
See application file for complete search history.

(56) References Cited

U.S. PATENT DOCUMENTS 5,164,365 A    11/1992    Bachmann et al.
6,469,427 B1    10/2002    Itaya et al.
(Continued)

FOREIGN PATENT DOCUMENTS

EP    0821833 A1    2/1998
EP    1098350 A1    5/2001
(Continued)

OTHER PUBLICATIONS

Decision to Grant for Japanese Patent Application No. 2013-501265, mailed Jun. 7, 2016, 4 pages.
(Continued)

*Primary Examiner* — Mariceli Santiago
(74) *Attorney, Agent, or Firm* — Withrow & Terranova, P.L.L.C.; Vincent K. Gustafson

(57) ABSTRACT

Interfaces for electrical (e.g., lighting) devices involve use of electrically conductive edge contacts arranged on or protruding from edges of printed circuit boards (PCBs) that provide or facilitate electrical connections to first and second externally accessible electrical contacts, such as may include threaded and foot contacts of a lighting device including a screw-shaped male base. First and/or second edge contacts of a PCB may protrude through first and second openings in a housing to form first and second externally accessible contact, or directly engage first and second externally accessible contact elements associated with (e.g., retained by) the housing. A contact element retained by a housing may define a slot in the interior of the housing to directly engage an edge contact of the PCB. Electric power is supplied to the PCB via edge contacts without need for intervening wires or soldered connections.

20 Claims, 6 Drawing Sheets

(51) Int. Cl.
  *H05K 7/00* (2006.01)
  *F21K 99/00* (2016.01)
  *F21V 7/00* (2006.01)
  *H01J 5/54* (2006.01)
  *H05K 3/40* (2006.01)
  *F21V 29/77* (2015.01)
  *F21K 9/90* (2016.01)
  *F21V 23/06* (2006.01)
  *F21K 9/23* (2016.01)
  *H05K 1/11* (2006.01)
  *F21Y 115/10* (2016.01)

(52) U.S. Cl.
  CPC ............ *F21V 23/06* (2013.01); *F21V 29/773* (2015.01); *H01J 5/54* (2013.01); *H05K 3/403* (2013.01); *F21Y 2115/10* (2016.08); *H05K 1/117* (2013.01); *H05K 2201/1034* (2013.01)

(56) References Cited

U.S. PATENT DOCUMENTS

| | | |
|---|---|---|
| 6,488,538 B1 | 12/2002 | Matsuba et al. |
| 6,717,341 B1 | 4/2004 | Matsuba et al. |
| 7,086,756 B2 | 8/2006 | Maxik |
| 7,213,940 B1 | 5/2007 | Van De Ven et al. |
| 7,597,455 B2 | 10/2009 | Smith et al. |
| 7,726,836 B2 | 6/2010 | Chen |
| 9,039,271 B2 | 5/2015 | Adams |
| 2005/0243552 A1 | 11/2005 | Maxik |
| 2006/0227558 A1 | 10/2006 | Osawa et al. |
| 2007/0025109 A1 | 2/2007 | Yu |
| 2007/0121319 A1 | 5/2007 | Wolf et al. |
| 2009/0135595 A1 | 5/2009 | Chen |
| 2009/0196034 A1 | 8/2009 | Gherardini et al. |
| 2009/0237932 A1 | 9/2009 | Lee |
| 2009/0268461 A1 | 10/2009 | Deak et al. |
| 2009/0295268 A1 | 12/2009 | Peng |
| 2009/0302730 A1 | 12/2009 | Carroll et al. |
| 2010/0026157 A1 | 2/2010 | Tanaka et al. |
| 2011/0028015 A1* | 2/2011 | Mostoller ............ H01J 5/50 439/280 |

FOREIGN PATENT DOCUMENTS

| | | |
|---|---|---|
| EP | 2083214 A1 | 7/2009 |
| JP | 2004031002 A | 1/2004 |
| JP | 3155167 U | 10/2009 |
| KR | 10-2008-0096015 A | 10/2008 |
| WO | 2008134056 A1 | 11/2008 |

OTHER PUBLICATIONS

Notification of the Fourth Office Action for Chinese Patent Application No. 201180025507.7, issued Oct. 26, 2015, 4 pages.
Notice of Reasons for Rejection for Japanese Patent Application No. 2013-501265, mailed Dec. 8, 2015, 6 pages.
English Translation of the Notice of Reasons for Rejection for Japanese Patent Application No. 2013-501265, mailed Dec. 8, 2015, 3 pages.
Search Report for Chinese Patent Application No. 201180025507.7 based on International Application No. PCT/US2011/024086 dated May 27, 2014, 2 pages.
Notification of the Second Office Action and Search Report for Chinese Patent Application No. 201180025507.7, issued Jan. 14, 2015, 15 pages.
Notification of the Third Office Action and Search Report for Chinese Patent Application No. 201180025507.7, issued Jun. 8, 2015, 13 pages.
Extended European Search Report for European Patent Application No. 11 75 9860.7 dated Dec. 17, 2013, 4 pages.
Reasons for Refusal for Japanese Patent Application No. 2013-501265, issued Nov. 11, 2014, 5 pages.
Notice of Reasons for Rejection for Japanese Patent Application No. 2013-501265, mailed Mar. 10, 2015, 5 pages.
Non-Final Office Action for U.S. Appl. No. 12/730,802, mailed Jun. 6, 2013, 10 pages.
Final Office Action for U.S. Appl. No. 12/730,802, mailed Oct. 3, 2013, 13 pages.
Advisory Action for U.S. Appl. No. 12/730,802, mailed Dec. 5, 2013, 3 pages.
Non-Final Office Action for U.S. Appl. No. 12/730,802, mailed Apr. 25, 2014, 12 pages.
Final Office Action for U.S. Appl. No. 12/730,802, mailed Sep. 16, 2014, 12 pages.
Notice of Allowance for U.S. Appl. No. 12/730,802, mailed Jan. 23, 2015, 7 pages.

* cited by examiner

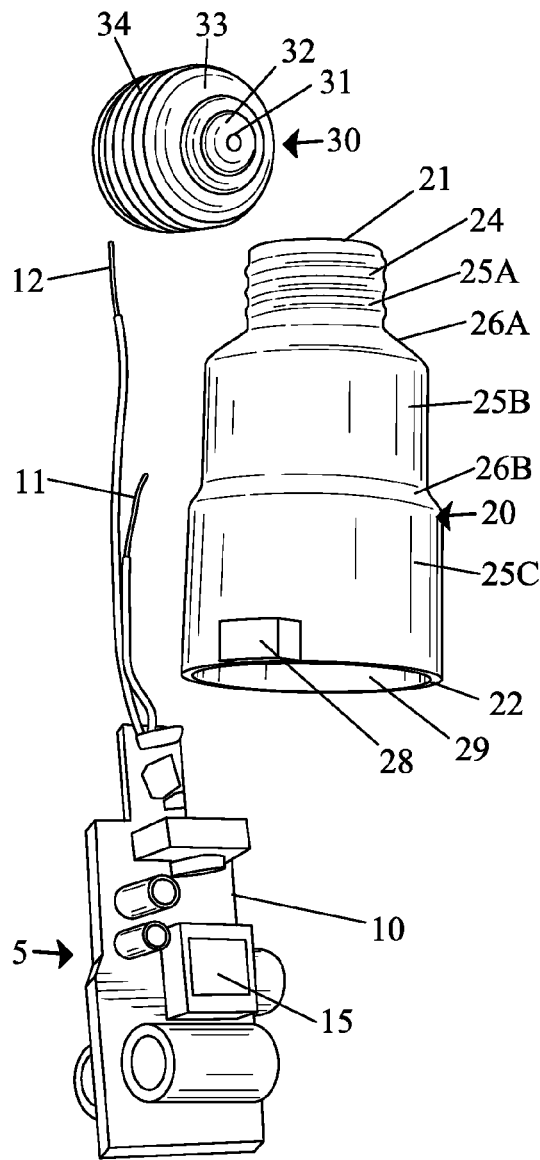
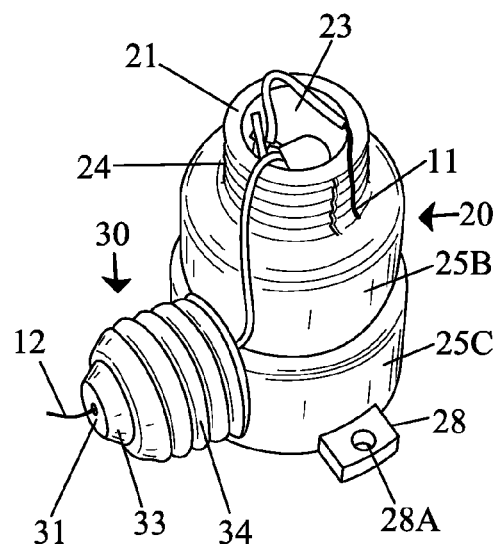
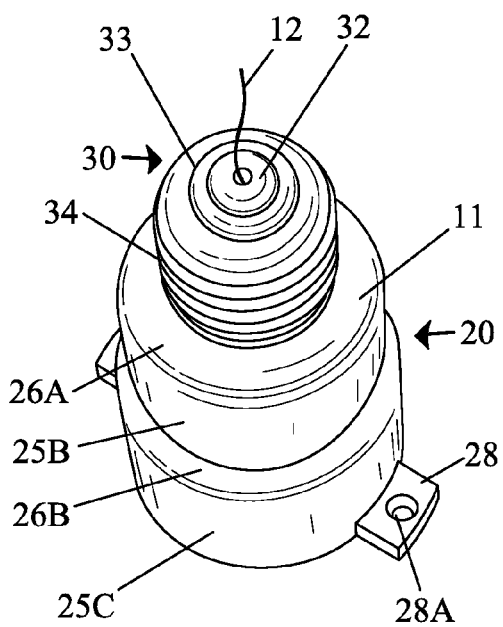
FIG._1A (RELATED ART)
FIG._1B (RELATED ART)
FIG._1C (RELATED ART)

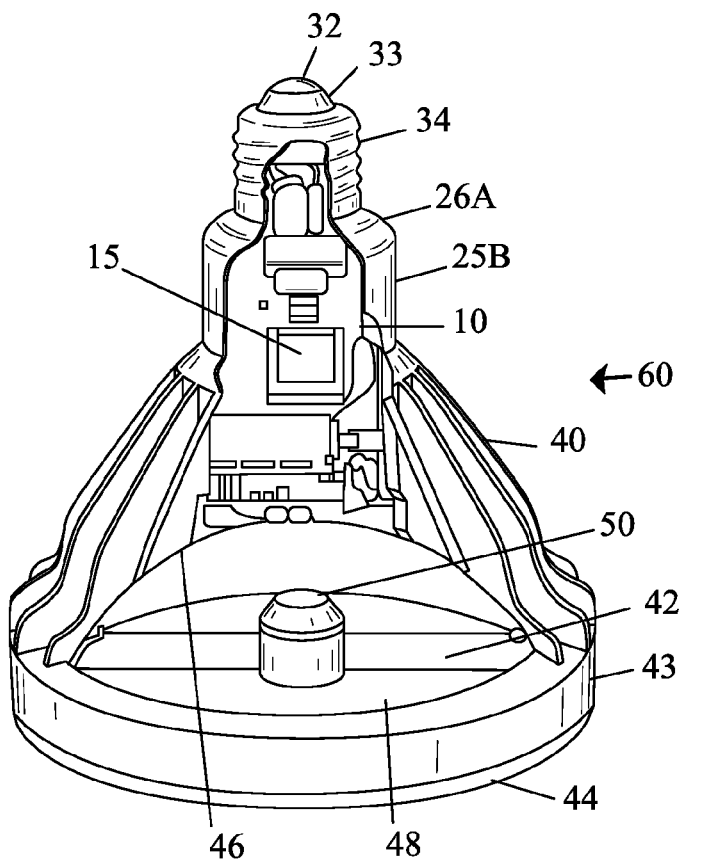
FIG._2A
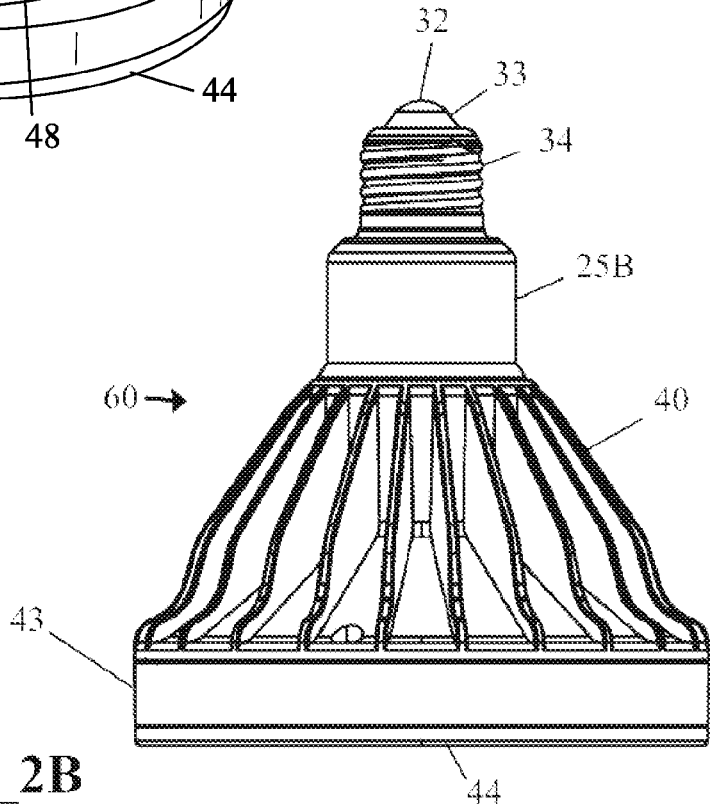
FIG._2B

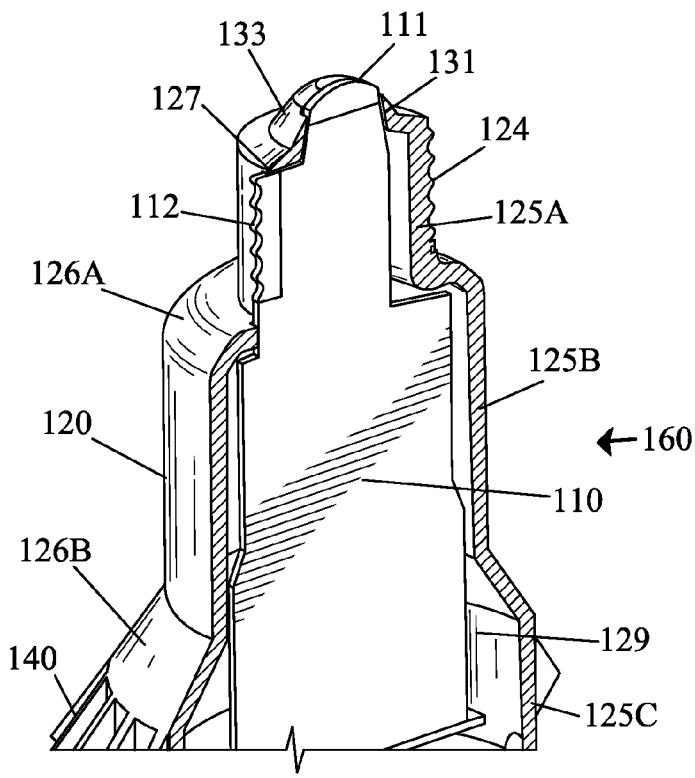
FIG._3A
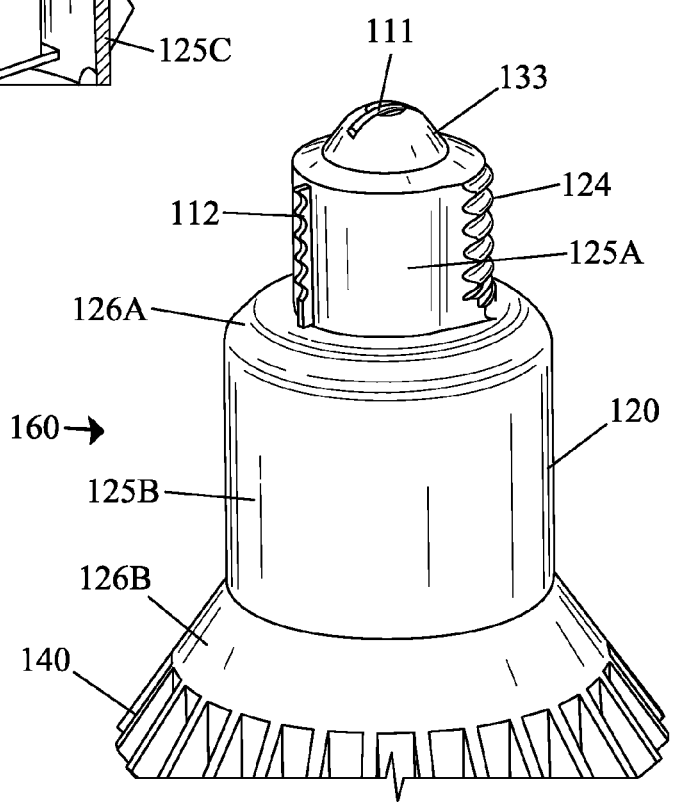
FIG._3B

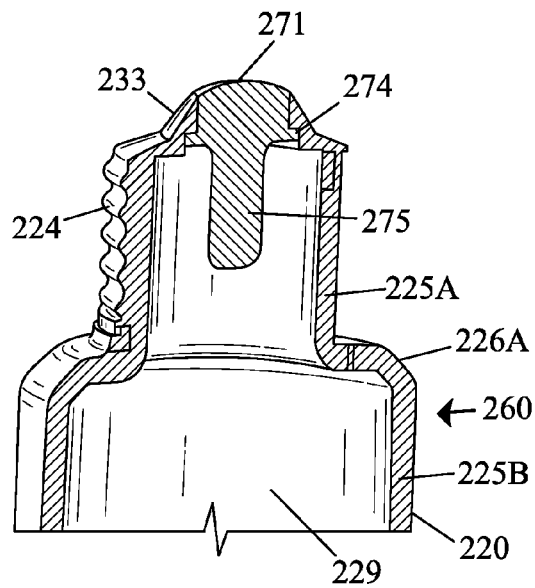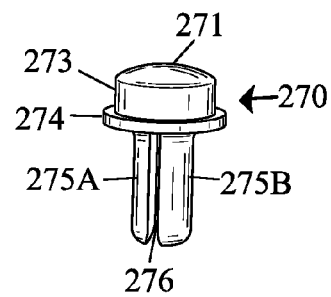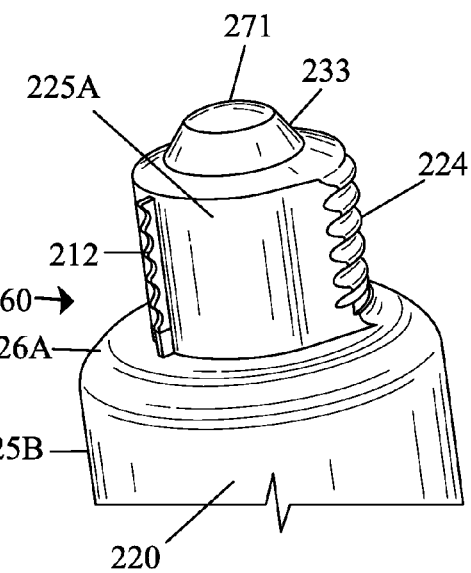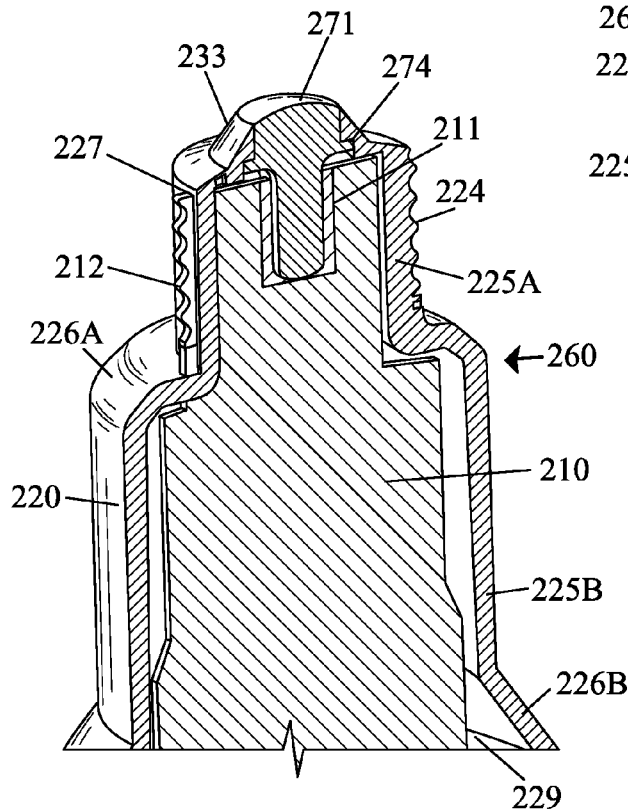
FIG._4A  FIG._4B  FIG._4C  FIG._4D

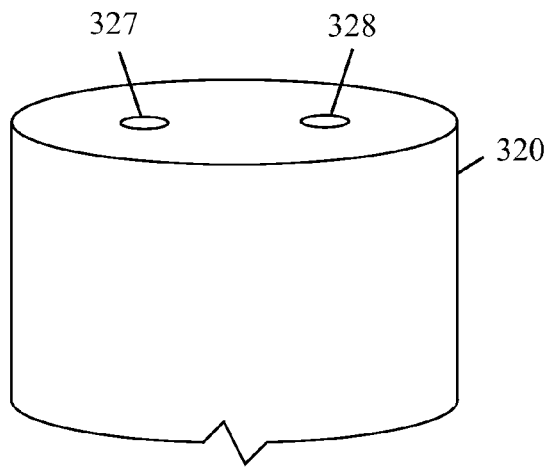
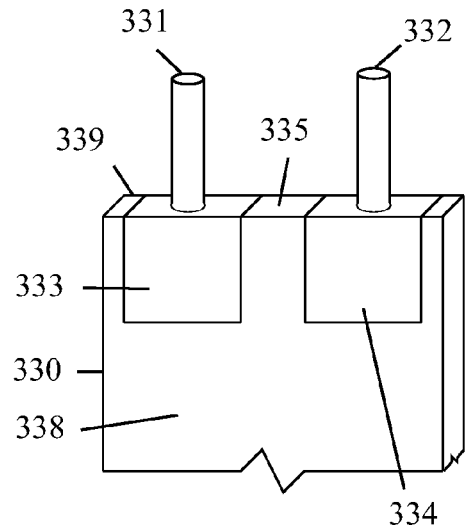
FIG._5B
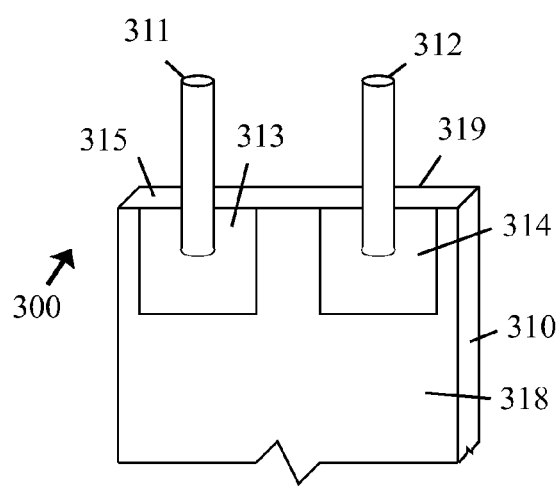
FIG._5A
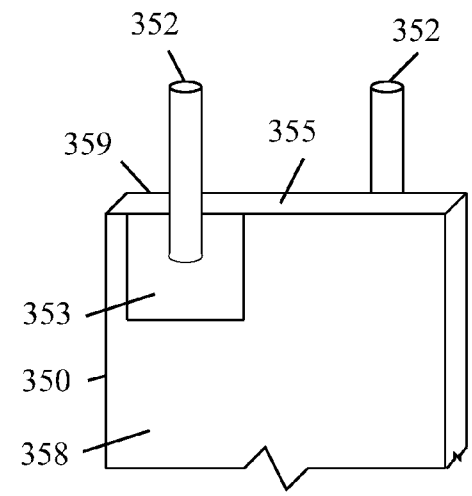
FIG._5C

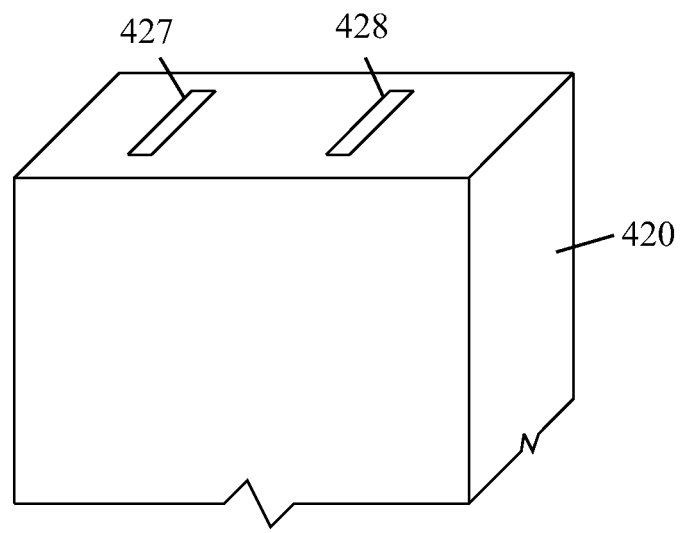
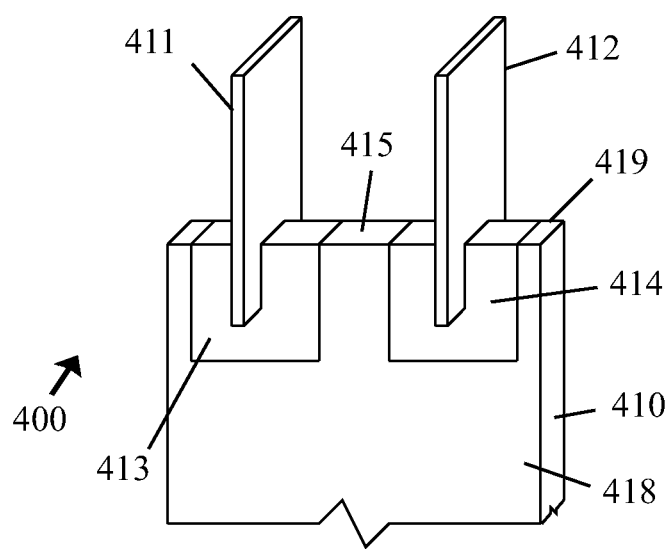
FIG._6

INTERFACE AND FABRICATION METHOD FOR LIGHTING AND OTHER ELECTRICAL DEVICES

CROSS-REFERENCE TO RELATED APPLICATION(S)

This application is a continuation of U.S. patent application Ser. No. 12/730,802 filed on Mar. 24, 2010 and subsequently issuing as U.S. Pat. No. 9,039,271 on May 26, 2015, with the foregoing application and patent being hereby incorporated by reference herein, for all purposes.

TECHNICAL FIELD

The present disclosure relates to electrical interfaces and fabrication methods for lighting devices (including solid state lighting devices) and other electrical devices.

BACKGROUND

Solid state light sources may be utilized to provide colored or white LED light (e.g., perceived as being white or near-white), as has been investigated as potential replacements for white incandescent lamps. Solid state light sources are particularly desirable for their potentially high efficiency and long life relative to other (e.g., incandescent, halogen, fluorescent, etc.) light sources. A solid state lighting device may include, for example, at least one organic or inorganic light emitting diode ("LED") or a laser, optionally coated with at least one phosphor to achieve a desired color or combination of colors. Combined emissions from multiple solid state and/or phosphor emitters (e.g., blue+yellow, red+green+blue, or other suitable color combinations) may be perceived by a viewer as white light. Various methods for generating white light from solid state emitters and phosphors are further disclosed in U.S. Pat. No. 7,213,940, which is hereby incorporated by reference as if set forth fully herein.

Given the enormous installed base of incandescent lamps and light fixtures having threaded Edison-type sockets, a substantial financial incentive exists for manufacturers to produce solid state lamps capable of being retrofitted into existing Edison-type threaded fixtures. Edison-type threaded sockets are conventionally used to power incandescent light bulbs from an AC power source, with such a socket arranged to mate with a male base including a screw thread contact and an electrical foot contact.

Solid state emitters require constant current to maintain proper light emission. If current to a solid state emitter varies, the luminous intensity and chromaticity may vary (e.g., white LEDs may shift toward blue in color) and excessive heating may result, potentially leading to shortened life or damage. White LEDs are conventionally powered in different ways, including: (a) a current source and ballast resistors; (b) multiple current sources; and (c) a current source (e.g., inductor-based boost converter) with multiple LEDs in series connection. Each of the foregoing power circuit types are advantageously implemented with components mounted to a printed circuit board (PCB), optionally including at least one integrated circuit and/or processor. Dimming is also a concern for white LED emitters, since standard TRIAC-based dimming schemes applicable to incandescent lamps are not directly applicable to LEDs. LED dimming is typically done through pulse width modulation (PWM), rather than TRIAC-based dimming (which delays turning on energy to a bulb following every zero crossing of an AC power source). To enable white light LEDs to interface with TRIAC-based dimmers, a driver circuit (such as the National Semiconductor LM3445) can be used to monitor the waveform from a standard TRIAC dimmer and adjust same to supply the correct PWM duty cycle and current. Such driver circuitry is also desirably implemented with components mounted to a PCB. Further control circuitry may be associated with a PCB to adjust color and/or chromaticity of solid state emitters. A PCB and associated circuitry may be desirably contained within a housing (or envelope) of a solid state lighting device to protect the circuitry from impact and/or exposure to ambient conditions.

With reference to FIGS. 1A-1C, a conventional method for assembling a threaded Edison base solid state lighting device having a PCB involves multiple steps, including establishment of electrical connections to the PCB. FIG. 1A depicts a PCB 10, a housing 20, and an Edison cap 30. The PCB 10 has electrical components 15 mounted thereon and interface wires 11, 12, to form a PCB assembly 5. The housing 20 includes a first open end 21, a second open end 22, and progressively larger stepped first, second, and third body portions 25A-25C with intermediate transitions or shoulders 26A-26B therebetween. Screw threads 24 are provided on a lateral surface of the first body portion 26A. The housing 20 defines a cavity or hollow interior 29. An attachment lug 28 including an aperture 28 protrudes outward from the third body portion 25C. The generally cylindrical Edison cap 30 includes a threaded sidewall contact 34, an insulating transition 33, and a protruding foot contact 32 defining an aperture 31 therein. A first step in establishing electrical connection to the PCB 10 and components 15 thereon includes soldering the two interface wires 11, 12 to the PCB 10 (e.g., for line and neutral connections). Next, the PCB assembly 5 is inserted into the cavity 29 of the housing 20 and the wires 11, 12, are routed out of the open top end 21. As shown in FIG. 1B, one wire 11 is routed against the first body portion 25A to mate with the threads 24, and the other wire 12 is routed through the interior of the Edison cap 30 to project through the aperture 31 defined in the foot contact 32. The Edison cap 30 is then screwed into position (as shown in FIG. 1C) to engage the threads 24 and enclose the first end 21 of the housing 20, with the wires 11, 12, protruding from the bottom of the sidewall 34 and from the aperture 31, respectively. Thereafter the two wires 11, 12, are soldered in their respective positions and trimmed flush to the solder joints (not shown). The foregoing steps in combination are not susceptible to inexpensive automation, and therefore require substantial labor for completion thereof.

A solid state lighting device 60 comprising the PCB 10 with components 15, the housing 20, and the Edison cap 30 is illustrated in FIGS. 2A-2B. In addition to the components described in connection with FIGS. 1A-1C, the lighting device 60 includes fins 40 associated with the body 20 to dissipate heat generated by the lighting device 60, a reflector 40 disposed below the PCB 10, at least one solid state light emitting element 50 arranged to emit light toward the reflector 40, at least one support 42 for the at least one light emitting element 50, a lens 48, and a peripheral ring or bezel 43 disposed along an emitting end 44 of the device 60.

Other electrical devices having PCBs are fabricated by soldering wires between PCB and externally accessible electrical connectors. Establishing such soldered connections is labor-intensive and provides potential for fabrication errors.

It is known to conduct DC supply power to low-current devices through universal serial bus (USB) connectors that include metalized contacts on an insulating substrate. USB connectors are well-suited for charging and/or powering low-current devices, but are generally not used to conduct AC power, and further may not be well-suited for light fixtures or applications requiring electrical currents exceeding one or more amperes.

It would be desirable to reduce the labor associated with conventional methods for establishing electrical connections to a PCB during assembly of electrical devices, including threaded Edison base solid state lighting devices. It would also be desirable to improve the reliability of such electrical connections, and improve manufacturing yield.

SUMMARY

The present disclosure relates to interfaces and fabrication methods for electrical (e.g., lighting) devices, involving use of first and second electrically conductive edge contacts arranged on or protruding from an edge of a substrate (e.g., printed circuit board), with such edge contacts either serving externally accessible electrical conductive contacts or being in electrical communication with externally accessible electrical contact elements without use of intervening wires or soldered connections.

In one aspect, the disclosure relates to a lighting device comprising: a housing having associated therewith at least one externally accessible electrically conductive contact; at least one light emitting element associated with the housing; and a substrate arranged for insertion into at least a portion of the housing, the substrate including at least one electrically conductive edge contact arranged on or protruding from an edge of the substrate, wherein the at least one externally accessible electrically conductive contact either (a) comprises the at least one electrically conductive edge contact, or (b) is in electrical communication with the at least one electrically conductive edge contact without use of any intervening wire or soldered connection; and the lighting device comprises at least one of the following features (i) and (ii): (i) the at least one externally accessible electrically conductive contact is arranged to contact an AC power source and conduct AC power; and (ii) the housing comprises a plurality of openings, the at least one externally accessible electrically conductive contact comprises a plurality of externally accessible electrically conductive contacts, and each opening of the plurality of openings is arranged to receive a different externally accessible electrically conductive contact of the plurality of externally accessible electrically conductive contacts.

In another aspect, the disclosure relates to a lighting device comprising: a housing including a male base, at least one lighting emitting element associated with the housing; and a printed circuit board (PCB) configured for electrical connection to the at least one light emitting element, the PCB including an end within the male base, and at least one electrically conductive edge contact arranged on or protruding from an edge of the PCB, wherein the at least one electrically conductive edge contact either (a) protrudes through an opening defined in the male base to form at least one externally accessible electrically conductive contact, or (b) is in electrical communication with at least one externally accessible electrically conductive contact without use of any intervening wire or soldered connection; and the lighting device comprises at least one of the following features: (i) the at least one externally accessible electrically conductive contact is arranged to contact an AC power source and conduct AC power; and (ii) the housing comprises a plurality of openings, the at least one externally accessible electrically conductive contact comprises a plurality of externally accessible electrically conductive contacts, and each opening of the plurality of openings is arranged to receive a different externally accessible electrically conductive contact of the plurality of externally accessible electrically conductive contacts.

In another aspect, the disclosure relates to a printed circuit board (PCB) adapted for use with a lighting device including a housing defining a screw-shaped male base with a protruding tip, the base including or having associated therewith an externally accessible electrical lateral contact, and the base including or having associated therewith an externally accessible electrical foot contact at the protruding tip, wherein the PCB comprises (i) at least a portion arranged for insertion into the male base; (ii) a first electrically conductive edge contact arranged on or protruding from an edge of the PCB and adapted to either (a) protrude through a lateral opening in the male base to form the electrical lateral contact, or (b) directly engage the electrical lateral contact, and (iii) a second electrically conductive edge contact arranged on or protruding from an edge of the PCB and adapted to either (a) protrude through a tip opening in the male base to form the electrical foot contact, or (b) directly engage the electrical foot contact.

In another aspect, the disclosure relates to lighting device comprising an electrically insulating housing including a screw-shaped male base with a protruding tip, an externally accessible electrical lateral contact, and an externally accessible electrical foot contact, the lighting device being characterized by at least one of the following features (a) and (b): (a) the lateral contact is adapted to compressively engage a first electrically conductive edge contact arranged on or protruding from an edge of a printed circuit board (PCB) adapted for insertion into the housing; and (b) the foot contact is adapted to compressively engage a second electrically conductive edge contact arranged on or protruding from an edge of a printed circuit board (PCB) adapted for insertion into the housing.

In a further aspect, the disclosure relates to a method for fabricating a lighting device, the method comprising inserting into a housing a circuit board having a first electrically conductive edge contact arranged on or protruding from an edge of the circuit board and having a second electrically conductive edge contact arranged on or protruding from an edge of the circuit board, wherein said insertion causes the first electrically conductive edge contact to either (a) protrude through at least one opening in the housing to form a first externally accessible electrical contact, or (b) directly engage a first externally accessible electrical contact element associated with the housing, and wherein said insertion causes the second electrically conductive edge contact to either (a) protrude through at least one opening in the housing to form a second electrically accessible electrical contact, or (b) directly engage a second externally accessible electrical contact element associated with the housing.

In another aspect, any one or more aspects or features may be combined for additional advantage.

Other aspects, features and embodiments of the disclosure will be more fully apparent from the ensuing disclosure and appended claims.

BRIEF DESCRIPTION OF THE DRAWINGS

FIG. 1A is a photograph depicting as unassembled a perspective view of a housing of an Edison base lighting device, a perspective view of a printed circuit board (PCB) with control elements sized for placement within the housing portion, and a perspective view of a threaded Edison cap arranged to mate with an externally threaded portion of the housing.

FIG. 1B is a perspective view photograph depicting the housing, PCB, and Edison cap of FIG. 1A in a partially assembled state, with the PCB inserted into the housing, but prior to engagement of the threaded Edison cap to the housing.

FIG. 10 is a perspective view photograph depicting the housing, PCB, and Edison cap of FIGS. 1A-1B in a further assembled state, with the PCB inserted into the housing, and with the threaded Edison cap engaged to the housing.

FIG. 2A is a perspective cutaway view of an Edison-type threaded base solid state lighting device including the housing portion, PCB with control elements, and Edison cap of FIGS. 1A-1C.

FIG. 2B is a side elevation view of the solid state lighting device of FIG. 2A.

FIG. 3A is a simplified perspective cutaway view of at least a portion of a lighting device with a threaded male base according to one embodiment of the present disclosure, the lighting device including a printed circuit board with a first electrically conductive edge contact protruding through a lateral opening in the male base to form a lateral electrical contact, and with a second electrical edge contact that extends through a tip of the threaded male base to form an electrical foot contact.

FIG. 3B is a perspective view of the lighting device portion of FIG. 3A.

FIG. 4A is a perspective cross-sectional view of a portion of a housing of a lighting device with a threaded male base according to another embodiment of the present disclosure, with a slot-defining electrically conductive pin insert molded into a protruding tip of the threaded male base to form an electrical foot contact.

FIG. 4B is a perspective view of the slot-defining electrically conductive pin illustrated in FIG. 4A.

FIG. 4C is a simplified perspective cutaway view of at least a portion of a lighting device including the housing and slot-defining electrically conductive pin of FIG. 4A, and including a printed circuit board with a first electrically conductive edge contact protruding through a lateral opening in the male base to form a lateral electrical contact, and with a second electrical edge contact inserted into the slot to directly engage the electrically conductive pin that forms the electrical foot contact.

FIG. 4D is a perspective view of the lighting device portion of FIG. 4C.

FIG. 5A is a perspective assembly view of a portion of an electrical device, including a housing portion and a circuit board portion with two edge contacts arranged for insertion into the housing portion, the two edge contacts extending above the circuit board and affixed to one face of the circuit board.

FIG. 5B is a perspective view of a first alternative circuit board portion with two edge contacts extending above the circuit board and affixed to an upper edge of the circuit board.

FIG. 5C is a perspective view of a second alternative circuit board portion with first and second edge contacts extending above the circuit board and affixed to opposing faces of the circuit board.

FIG. 6 is a perspective assembly view of a portion of another electrical device, including a housing portion and a circuit board portion with two edge contacts arranged for insertion into the housing portion, the two edge contacts extending above the circuit board and affixed to opposing faces and an upper edge of the circuit board.

DETAILED DESCRIPTION

The present disclosure relates to improved interfaces and fabrication methods for electrical (e.g., lighting) devices incorporating printed circuit boards (PCBs) or other substrates, by eliminating the need for soldered connecting wires between PCBs/substrates and externally accessible electrical contacts. Wired connections may be eliminated by use of PCB edge contacts. Certain embodiments relate to include Edison-type screw-shaped threaded male base lighting devices The term "edge contact" as used herein refers to an electrically conductive contact disposed along an edge of a substrate (e.g., a PCB). An edge contact may be arranged on or protruding from an edge of a substrate. In certain embodiments, an edge contact may include electrically conductive material (e.g., copper, gold, or another suitably conductive metal, or a conductive polymer) metalized or otherwise disposed at least on an edge of the PCB, preferably extending to at least one face of the PCB, and more preferably extending to both opposing faces of the PCB. Electrically conductive material may be deposited according to conventional metallization processes. In certain embodiments, an edge contact may include an electrically conductive material (e.g., a plate, a clip, a plug, or the like) engaged on or against a portion of a PCB to extend from an edge of the PCB.

At least one opening may be defined in a housing of an electrical (e.g., lighting) device to receive at least one edge contact of a PCB and enable the at least one edge contact to extend through the housing. In one embodiment, an edge contact of a PCB protrudes through a lateral opening defined in a male base, with the edge contact including a fluted edge defining protrusions and grooves arranged to follow a lateral profile of threads of a screw-shaped male base. Such conformation allows a lateral edge contact to protrude through a lateral opening of the male base without interfering with the ability to screw the male base into a corresponding threaded socket of a lamp or other light fixture. In another embodiment, an edge contact of a PCB comprises a substantially flat or smooth edge lacking protrusions or grooves, with the flat or smooth edge arranged to protrude through a lateral opening defined in the male base to a lateral extent that is less than projecting portions of the threads of the base, but that is greater than or equal to recessed portions of the threads of the base. In such an embodiment, upon threaded insertion of the lighting device into a female threaded socket, the flat or smooth edge of the PCB would still be arranged to contact the threaded side wall of the female socket, in order to make electrical contact between the threaded socket side wall and the flat or smooth edge of the (lateral) edge contact.

In one embodiment, an opening is defined in a protruding tip of a screw-shaped male base, and an edge contact of a PCB protrudes through such opening to form an electrical foot contact of a lighting device.

In another embodiment, at least one edge contact of a PCB does not extend through an opening defined in a housing of a lighting device, but rather is directly engaged with an externally accessible electrically conductive contact element forming an electrical foot contact or a lateral contact of a lighting device. An externally accessible contact element is preferably located along an external portion of an electrical device, and is preferably arranged for connection to a power source or circuit element. An externally accessible electrically conductive contact element may be integrally formed with at least a portion of the housing, which may be electrically insulating in character, or the conductive contact element may be prefabricated and affixed to or inserted into an electrical insulating portion of the housing by a process including at least one of insert molding, heat staking (e.g., including heating of the housing and pressing or insertion of the conductive contact element), ultrasonic insertion, spin welding, press fitting (with or without heating), and application of pressure optionally aided by heating of the housing and/or cooling of the conductive contact element. "Direct engagement" refers generally to connection without an intervening wire, and preferably to the absence of an intervening soldered connection. Direct engagement preferably includes mechanical contact, which may be maintained with a biasing force and/or mechanical compression (e.g., compressive engagement). One or more conductive elements may be retained by the housing to form a lateral contact and/or a foot contact for a lighting device, with one or more edge contacts of a PCB arranged to directly engage (e.g., compressively engage) the one or more externally accessible electrically conductive contact elements. In one embodiment, an externally-accessible conductive element forming an electrical foot contact or a lateral contact of a lighting device defines a slot bounded by electrically conductive material within the housing of a lighting device, and a PCB edge contact is inserted into the slot to provide direct engagement. Such a slot may be tapered to promote compressive engagement between the conductive element and the edge contact. Biasing elements, springs, gaskets, washers, and the like may alternatively or additionally be used within a housing to promote maintenance of direct contact between a PCB edge contact and an interior portion of a conductive element disposed within a housing of a lighting device—with the conductive element having another portion that is accessible along the exterior of the lighting device. In one embodiment, a first conductive element is retained by portion of a housing to form an externally accessible lateral contact for a lighting device, and a second conductive element is retained by a portion of the housing to form an externally accessible foot contact for the lighting device, with a first edge contact of a PCB arranged to directly engage the first conductive element within the housing, and with a second edge contact of the PCB arranged to directly engage the second conductive element within the housing.

In one embodiment, a PCB adapted for use with a screw-shaped male base lighting device includes a first electrically conductive edge contact that either (a) protrude through a lateral opening in the male base to form an electrical lateral contact, or (b) directly engage an electrical lateral contact; and includes a second electrically conductive edge contact that either (a) protrudes through a tip opening in the male base to form an electrical foot contact of the lighting device, or (b) directly engages an electrical foot contact of the lighting device, wherein the electrical lateral contact is arranged along a threaded lateral surface of the screw-shaped male base, and the electrical foot contact is arranged at a protruding tip of the screw-shaped male base.

A PCB or other substrate as referenced herein preferably has mounted thereon or associated therewith at least one component arranged to control or affect operation of a light emitting element or other electronic element. In various embodiments, a PCB includes a ballast and/or a driver for at least one light emitting element. A PCB may include a dimming circuit. A light emitting element advantageously includes at least one solid state light emitting element. At least one solid state light emitting element may include at least one emitter or combination of emitters arranged to emit light perceived as white. In certain embodiments, at least one light emitting element comprises a fluorescent lamp, a high intensity discharge lamp, an incandescent lamp, and/or a halogen lamp. A plurality of emitters may be provided in a single lamp, including emitters arranged to emit different colors. In one embodiment, each emitter of a plurality of emitters is separately controllable. A PCB may include components and/or circuits to control individual emitters of a plurality of emitters in a lighting device. A PCB may include one or more integrated circuits and/or microprocessors, and one or more memory elements. A PCB may receive one or more input signals (e.g., user inputs, sensory inputs, network inputs, external controller inputs, and the like) and may generate one or more output signals. Operation of one or more emitters of a lighting device may be responsive to user inputs, sensory inputs, network inputs, and/or external controller inputs. Output signals may be used to operate one or more emitters of a lighting device, to generate user-perceptible alarms (e.g., audio and/or visual signals), to generate output data, and to coordinate operation with one or more light sources external to the lighting device.

In one embodiment, at least one sensor is electrically coupled to a PCB as disclosed herein, and extends into and/or through a housing of an electrical device.

At least a portion of a lighting device 160 including a PCB with edge contacts according to a first embodiment is depicted in FIGS. 3A-3B. The lighting device 160 includes a housing 120 defining a cavity or hollow interior 129 arranged to receive a PCB 10. The housing 120 includes progressively larger stepped first, second, and third body portions 125A-125C with intermediate transitions or shoulders 126A-126B therebetween, and having associated fins 140 for heat dissipation. The first body portion 125A constitutes a threaded male base, which includes a threaded sidewall portion 124 and also defines a lateral opening (e.g., rectangular slot or other shape) 127 arranged to receive an edge contact 112 of a PCB 110 to form a lateral contact of the lighting device 160. This edge contact 112 is preferably fluted in shape, and defines protrusions and grooves arranged to follow the lateral profile of threads 124 of the screw-shaped first body portion or base 125. A protruding portion 133 extends axially from the first body portion or base 125A. A tip aperture or tip opening 131 is defined in the protruding portion 133 and is arranged to receive another edge contact 111 of the PCB 110 to form an electrical foot contact of the lighting device 160. This edge contact 111 may be rounded in character to follow or conform to a rounded tip of the protruding portion 133. The tip opening 131 may be in any suitable shape, such as a rectangular slot, a substantially circular opening, or any other desired shape.

A method for fabricating the lighting device 160 includes inserting the PCB 110 (preferably including electrical components mounted thereon) into the housing 120, sufficient to cause one electrically conductive edge contact 112 to either (a) protrude through a lateral opening 127 in the first body portion or base 125A to form an electrical contact or (b) directly engage an electrical lateral contact (not shown), and sufficient to cause another electrically conductive edge contact to either (a) protrude through the tip opening 131 in the protruding portion 133 of the male base to form an electrical foot contact of the lighting device 160, or to directly engage an electrical foot contact (not shown) of the male base. More generically, insertion of a PCB into a housing may cause a first electrically conductive edge contact to either (a) protrude through at least one opening in the housing to form a first externally accessible electrical contact, or (b) directly engage a first externally accessible electrical contact element associated with the housing, and may further cause a second electrically conductive edge contact to either (a) protrude through at least one opening in the housing to form a second externally accessible electrical contact, or (b) directly engage a second externally accessible electrical contact element associated with the housing. The PCB 110 is preferably mechanically mounted or otherwise retained within the housing 120. A method for fabricating the lighting device may further include establishing electrical communication between the circuit board and at least one emitter (e.g., at least one solid state emitter) associated with the lighting device. The PCB 110 preferably includes at least one electrical contact (preferably multiple contacts) arranged to supply power to at least one emitter. The PCB may have associated therewith one or more wires and/or other suitable electrically conductive elements, as well as components arranged to control and/or affect operation of at least one electrically operative element (e.g., light emitters). In one embodiment, a PCB includes at least one of an integrated circuit, a microprocessor, and a memory element. A PCB may further include at least one associated input element that is externally accessible through a housing of an electrical device. Such input element may include, for example, a sensor port, a communication port, a data interface port, and/or a programming port.

At least a portion of a lighting device 260 including a PCB 210 with edge contacts according to a first embodiment is depicted in FIGS. 4A, 4C, and 4D. Such embodiment utilizes an electrically conductive insert (e.g., pin) 270 arranged to directly contact an edge contact 211 of a PCB 210 disposed within the interior 229 of the housing 220 of the lighting device 260. The conductive insert or pin 270 comprises an externally accessible tip 271 (that is preferably rounded or hemispherical in shape), a cylindrical body 273, a retaining structure (e.g., flared lip) 274, and a first leg 275A and a second leg 275B defining a slot 276 therebetween. The electrically conductive insert 270 is preferably integrally formed (e.g., insert molded) with at least the protruding portion 233 of the housing 200. At least the protruding portion 233 of the housing 220 may be electrically insulating in character. The retaining structure 274 is arranged to provide facilitate mechanical retention of the electrically conductive insert 270 within the protruding portion 233 of the housing 220, so as to prevent extraction or removal of the insert 270 from the housing 220. Although the retaining structure 274 is illustrated in FIGS. 4A-4C as being in the form of a protruding lip, it is to be appreciated that one or more protrusions and/or recesses may be substituted or additionally provided to provide similar mechanical retention utility.

The lighting device 260 includes a housing 220 defining a cavity or hollow interior 229 arranged to receive a PCB 210. The housing 220 includes progressively larger stepped first, second, and third body portions 225A-225C with intermediate transitions or shoulders 226A-226B therebetween, and having associated fins 240 for heat dissipation. The first body portion 225A constitutes a threaded male base, which includes a threaded sidewall portion 224 and also defines a lateral opening or slot 227 arranged to receive an edge contact 212 of the PCB 210 to form a lateral contact of the lighting device 260. This edge contact 212 is preferably fluted in shape, and defines protrusions and grooves arranged to follow the lateral profile of threads 224 of the screw-shaped first body portion or base 225, thus avoiding interference with an ability to screw the male base into a corresponding threaded socket of a lamp or other light fixture (not shown). A protruding portion 233 of the housing 220 extends axially from the first body portion or base 225A.

After the electrically conductive insert 270 is disposed (e.g., retained) in the protruding portion 233 of the housing 220 for form an electrical foot contact, a PCB 210 (preferably including electrical components mounted thereon) is inserted into the housing 220, sufficient to cause a first electrically conductive edge contact 212 to protrude through the lateral opening 227 in the first body portion or base 225A, and sufficient to cause a second electrically conductive edge contact 211 to be inserted between conductive legs 275A, 275B into the slot 276 and directly engage the electrically conductive insert 270 that forms an electrical foot contact of the lighting device 160. The PCB 210 is preferably mechanically mounted or otherwise retained within the housing 220.

The use of PCBs with edge contacts as described herein to serve as or directly engage outwardly accessible contacts of a lighting device greatly simplifies manufacturing, because steps associated with soldering wires to a PCB, routing wires through the housing, soldering wire ends to an Edison cap, and trimming wires after soldering, are avoided. Manufacturing costs are reduced, and electrical connections of high reliability are attained.

Although screw-shaped male base lighting devices with PCBs have been described herein with emphasis on use with solid state emitters (e.g., LEDs), it is to be appreciated that devices and fabrication methods described herein are applicable to lighting devices embodying other connection types (including but not limited to multi-pin lamp connectors) and other types of emitters, including, for example, fluorescent emitters, high intensity discharge emitters, incandescent emitters, and/or halogen emitters.

In preferred embodiments, at least one electrically accessible conductive contact (e.g., an edge contact, or a contact in electrical communication with at least one externally accessible electrically conductive contact without use of any intervening wire or soldered connection) is arranged to contact an AC power source and conduct AC power. In various embodiments, the AC power source may have a line voltage of at least about 100V, at least about 110V, at least about 120V, or at least about 220V. A printed circuit board with which one or more edge connectors is associated may include at least one AC/DC conversion element (e.g., a rectifier). A PCB may further include at least one of a driver and a ballast for at least one light emitting element.

In certain embodiments, the housing of an electrical device (e.g., a lighting device) includes multiple openings each arranged to receive a different externally accessible electrically conductive contact. In one embodiment, each opening is arranged to receive a different electrically conductive edge contact. Different edge contacts received by different openings in a housing may be associated with different regions of a single PCB, or with different PCBs. Externally accessible electrically conductive contacts (e.g., edge contacts) may extend into or through openings defined in the housing. Presence of multiple contacts received by different openings in a housing of an electrical device may be beneficial to provide structural support to the contacts or underlying substrates, and to guard against inadvertent short-circuiting by conductive materials that may be placed in proximity to the contacts.

The foregoing structures and fabrication methods are also applicable to electrical devices generically, whether or not including lighting devices, and whether or not including threaded base Edison connectors.

FIG. 5A is a perspective assembly view of a portion of an electrical device 300, including a housing portion 320 and a circuit board or substrate portion 310 with two edge contacts 311, 312 arranged for insertion into the housing portion 320. The housing portion 320 includes openings 327, 328 arranged to permit insertion of the edge contacts 311, 312 therethrough. The circuit board 310 includes a first face 318, second face 319, and a border or edge portion 319. The two edge contacts 311, 312 extend above an upper end of the circuit board portion 310 and are affixed to the first face 318 of the circuit board 310 along conductive pads 313, 314. It is to be appreciated that a circuit board 310 may include numerous traces and associated electrical components (including traces in electrical communication with at least one edge contact and associated contact pads), but such traces and components have been omitted to promote clarity in explaining this embodiment of the present disclosure. Any of various types of mechanical supports (not shown) may be affixed to the circuit board 310 to support the edge contacts 311, 312. Although the edge contacts 311, 312 are shown as being substantially cylindrical in shape, edge contacts of any suitable shape, size, and conformation may be substituted. Upon insertion of the circuit board portion 310 into the housing 320, the edge contacts 311, 312 are preferably arranged to extend through the openings 327, 328 to protrude outward from the housing 310. In one embodiment, following insertion of a circuit board into a housing, edge contacts associated with the circuit board may be recessed within the housing (e.g., as female contacts arranged to receive an external male connector of compatible type (not shown)), but such recessed contacts still remain externally accessible. The circuit board 310 preferably includes an electrically insulating core material (e.g., FR-4) onto which one or more conductive portions such as pads 313, 314 (formable from copper, another metal, or a conductive polymer) may be deposited. At least a portion of the housing 310 may be electrically insulating to prevent short-circuiting between the edge connectors 311, 312.

FIGS. 5B-5C depict alternative circuit board portions arranged for use with a housing such as the housing 320 illustrated in FIG. 5A. In FIG. 5B, two edge contacts 331, 332 extend above an upper end of a circuit board 330 including a first face 338, a second face 339, and a border or edge portion 335. The two edge contacts 331, 332 are affixed to an upper edge 335 of the circuit board 330 along conductive pads 333, 334, which preferably extend along at least one face 338 and an edge portion 335 of the circuit board 330. In FIG. 5C, two edge contacts 351, 352 extend above an upper end of a circuit board 350 including a first face 358, a second face 359, and a border or edge portion 355. The two edge contacts 351, 352 are affixed to the first face 358 and second face 359, respectively, of the circuit board 350. The first face 358 includes a conductive pad 353 along the first edge contact 351; a similar conductive pad (not shown) is preferably provided along the second face 359 of the circuit board 350. Conductive traces and electrical and/or electronic components may be provided on one or both faces of a circuit board.

In one embodiment, edge contacts may be affixed to both faces and an upper edge of a circuit board. FIG. 6 is a perspective assembly view of a portion of an electrical device 400, including a housing portion 420 and a circuit board portion 410 with two edge contacts 411, 412. At least a portion of the circuit board 410 is arranged for insertion into an interior of the housing portion 420. The two edge contacts 411, 412 protrude upward from the circuit board 410 and are affixed to both faces 418, 419 and an upper edge 415 of the circuit board 410 with associated electrically conductive contact pads 413, 414. In one embodiment, the contact pads 413, 414 an edge contacts 411, 412 may be prefabricated (integrally formed) and affixed to the circuit board 410 using any appropriate means, including crimping, thermal bonding, soldering, and the like. In one embodiment, the edge contacts 411, 412 may be sized and shaped for insertion into a conventional AC power outlet. One or more additional edge contacts (not shown) may be provided as a ground contacts and/or additional power, control, sensory, and/or communication contacts to communicate signals to or from the electrical device 400 via the circuit board 410.

An electrical device may include at least one electrically operative element. a housing having associated therewith at least one externally accessible electrically conductive contact; and a substrate (e.g., a printed circuit board) arranged for insertion into at least a portion of the housing. The substrate may include at least one electrically conductive edge contact arranged on or protruding from an edge of the substrate. At least one externally accessible electrically conductive contact either (a) includes the at least one electrically conductive edge contact, or (b) is in electrical communication with the at least one electrically conductive edge contact without use of any intervening wire or soldered connection. At least one externally accessible electrically conductive contact may be arranged to contact an AC power source and conduct AC power.

In one embodiment, at least one externally accessible electrically conductive contact is prefabricated and is retained by a housing of an electrical device, and at least one electrically conductive edge contact is arranged to engage a portion of the at least one externally accessible electrically conductive contact within the housing.

In one embodiment, an electrical device comprises a housing including a male base; and a printed circuit board (PCB) configured for electrical connection to an electrically operative element, the PCB including an end within the male base, and at least one electrically conductive edge contact arranged on or protruding from an edge of the PCB; wherein the at least one electrically conductive edge contact either (a) protrudes through an opening defined in the male base to form at least one externally accessible electrically conductive contact, or (b) is in electrical communication with at least one externally accessible electrically conductive contact without use of any intervening wire or soldered connection (i.e., by direct engagement). Edge contacts may form lateral and/or foot contacts.

An electrical device as disclosed herein may include any desirable type(s) of electrically operable elements. In various embodiments, electrical devices according to the present disclosure may include audio and/or video devices, personal computing devices, telecommunication devices, lighting devices, heating and/or cooling devices, tools, pumps, blowers, personal care devices, and the like. In one embodiment, an electrical device is arranged for connection to an AC power source. In one embodiment, an electrical device is arranged for connection to a DC power source, such as a cigarette lighter adapter in a motor vehicle.

In one embodiment, electrically conductive edge contacts are arranged to be retractably deployed relative to the housing of an electrical device. Such retractable deployment may protect the electrically conductive edge contacts for transport or periods of non-use, may minimize physical interference with adjacent items, and may provide improved aesthetics. A circuit board to which the electrically conductive edge contacts are mounted may translate or rotate within a housing of an electrical device between multiple positions, preferably via at least one or more selectively operable manual or automated deployment mechanisms (e.g., a solenoid, a servomotor, a four-bar mechanism, a thumb slider, etc.) known in the art. Travel stops and/or biasing elements (e.g., springs, detents, compression elements, etc.) may be used to maintain the electrically conductive edge contacts (e.g., and associated circuit board) in any desired fully retracted or fully deployed position between retraction and deployment steps. Flexible connectors (e.g., ribbon cables or the like) may be arranged between a moveable circuit board and any other electrically operable components associated with the electrical device to maintain electrical connections following repeated deployment and retraction steps.

While the invention has been has been described herein in reference to specific aspects, features and illustrative embodiments of the invention, it will be appreciated that the utility of the invention is not thus limited, but rather extends to and encompasses numerous other variations, modifications and alternative embodiments, as will suggest themselves to those of ordinary skill in the field of the present invention, based on the disclosure herein. Correspondingly, the invention as hereinafter claimed is intended to be broadly construed and interpreted, as including all such variations, modifications and alternative embodiments, within its spirit and scope.

What is claimed is:

1. A light bulb comprising:
   a cavity-defining housing arranged between a contact-defining end and a light-transmitting end, and a male base proximate to the contact-defining end;
   a printed circuit board (PCB) at least partially disposed within the housing, wherein the PCB includes a first electrically conductive edge contact arranged on or proximate to a transverse edge of the PCB, and the PCB includes a second electrically conductive edge contact arranged on or proximate to a longitudinal edge of the PCB, with at least one boundary of the second electrically conductive edge contact being arranged closer than at least one boundary of the first electrically conductive edge contact to the light-transmitting end;
   an externally accessible electrically conductive foot contact arranged at the contact-defining end;
   an externally accessible electrically conductive lateral contact arranged on or along a lateral surface of the male base;
   a first compressive electrical interface arranged between the foot contact and the first electrically conductive edge contact, wherein the first compressive electrical interface is arranged to provide conductive electrical communication between the foot contact and the first electrically conductive edge contact; and
   a second compressive electrical interface arranged between the lateral contact and the second electrically conductive edge contact, wherein the second compressive electrical interface is arranged to provide conductive electrical communication between the lateral contact and the second electrically conductive edge contact.

2. The light bulb of claim 1, wherein the male base is screw-shaped, and the foot contact is arranged at a tip of the male base.

3. The light bulb of claim 1, wherein the first compressive electrical interface provides direct engagement between the foot contact and the first electrically conductive edge contact without use of any intervening wire or soldered connection, and the second compressive electrical interface provides direct engagement between the lateral contact and the second electrically conductive edge contact without use of any intervening wire or soldered connection.

4. The light bulb of claim 1, wherein one or more of the first compressive electrical interface or the second compressive electrical interface comprises at least one spring element or biasing element.

5. The light bulb of claim 1, wherein the foot contact comprises an electrically conductive pin that extends in a longitudinal direction between the contact-defining end and the PCB.

6. The light bulb of claim 5, wherein the first compressive electrical interface comprises at least one spring element or biasing element configured to promote engagement between the electrically conductive pin and the first electrically conductive edge contact.

7. The light bulb of claim 5, wherein the electrically conductive pin includes first and second conductive elements that are separated by a gap and that extend in a direction toward the light-transmitting end.

8. The light bulb of claim 5, wherein the electrically conductive pin is prefabricated and retained by an electrically insulating portion of the housing.

9. The light bulb of claim 5, wherein the electrically conductive pin is insert molded or heat staked into an electrically insulating portion of the housing.

10. The light bulb of claim 1, wherein the PCB comprises at least one of a ballast circuit, a driver circuit, or a dimmer circuit arranged to supply electrical signals to a plurality of solid state emitters arranged between the contact-defining end and the light-transmitting end.

11. A light bulb comprising:
    a cavity-defining housing arranged between a contact-defining end and a light-transmitting end, and a male base proximate to the contact-defining end;
    a printed circuit board (PCB) at least partially disposed within the housing, wherein the PCB includes a first electrically conductive edge contact arranged on or proximate to a bottom edge of the PCB, and the PCB includes a second electrically conductive edge contact arranged on or proximate to a lateral edge of the PCB, with at least one boundary of the first electrically conductive edge contact being arranged closer than at least one boundary of the second electrically conductive edge contact to the contact-defining end, and with the at least one boundary of the second electrically conductive edge contact being arranged closer than the at least one boundary of the first electrically conductive edge contact to the light-transmitting end;
    an externally accessible electrically conductive foot contact arranged at the contact-defining end;
    an externally accessible electrically conductive lateral contact arranged on or along a lateral surface of the male base; and
    a compressive electrical interface arranged between the foot contact and the first electrically conductive edge contact, wherein the compressive electrical interface is arranged to provide conductive electrical communication between the foot contact and the first electrically conductive edge contact;
    wherein the second electrically conductive edge contact extends through an aperture defined in the housing to define the lateral contact, with the second electrically conductive edge contact being externally accessible along the lateral surface of the male base.

12. The light bulb of claim 11, wherein the male base is screw-shaped and defines threads configured to be received by a threaded socket of a lighting device, and the second electrically conductive edge contact comprises a fluted edge defining a plurality of protrusions and a plurality of grooves arranged to follow a lateral profile of the threads of the screw-shaped male base.

13. A method for fabricating a light bulb, the method comprising inserting, into a housing, a printed circuit board (PCB) including a first electrically conductive edge contact arranged on or protruding from a transverse edge of the PCB and including a second electrically conductive edge contact arranged on or protruding from a longitudinal edge of the PCB, with at least one boundary of the second electrically conductive edge contact being arranged closer than at least one boundary of the first electrically conductive edge contact to a light-transmitting end of the light bulb that opposes a contact-defining end of the light bulb;
  wherein said insertion causes the first electrically conductive edge contact to engage an externally accessible electrically conductive foot contact retained by an electrically insulating portion of the housing, with a first compressive electrical interface arranged between the foot contact and the first electrically conductive edge contact, to provide conductive electrical communication between the foot contact and the first electrically conductive edge contact; and
  wherein said insertion causes the second electrically conductive edge contact to engage an externally accessible electrically conductive lateral contact associated with the housing, with a second compressive electrical interface arranged between the lateral contact and the second electrically conductive edge contact, to provide conductive electrical communication between the lateral contact and the second electrically conductive edge contact.

14. The method of claim 13, wherein one or more of the first compressive electrical interface or the second compressive electrical interface comprises at least one spring element or biasing element.

15. The method of claim 13, wherein the housing is arranged between the contact-defining end and the light-transmitting end of the light bulb, and a screw-shaped male base is arranged proximate to the contact-defining end.

16. The method of claim 13, further comprising mechanically mounting or retaining the PCB within the housing.

17. The method of claim 13, wherein the foot contact comprises an electrically conductive pin retained within an electrically insulating portion of the housing.

18. The method of claim 17, wherein the electrically conductive pin includes first and second electrically conductive elements that are separated by a gap and that extend in a direction toward the light-transmitting end, and wherein said insertion causes the first electrically conductive edge contact to extend into the gap and be compressively engaged between the first and second electrically conductive elements.

19. The method of claim 17, wherein the electrically conductive pin is prefabricated, and the method further comprises affixing the electrically conductive pin to the housing, or to a base associated with the housing, by a process including at least one of: insert molding, heat staking, ultrasonic insertion, spin welding, or press fitting.

20. The method of claim 13, further comprising establishing electrical communication between the PCB and at least one solid state emitter of the light bulb.

* * * * *